(12) United States Patent
Sato et al.

(10) Patent No.: US 7,100,146 B2
(45) Date of Patent: Aug. 29, 2006

(54) DESIGN SYSTEM OF ALIGNMENT MARKS FOR SEMICONDUCTOR MANUFACTURE

(75) Inventors: Takashi Sato, Fujisawa (JP); Takuya Kouno, Yokohama (JP); Takashi Sakamoto, Zushi (JP); Yoshiyuki Shioyama, Yokohama (JP); Tatsuhiko Higashiki, Fujisawa (JP); Ichiro Mori, Yokohama (JP); Noboru Yokoya, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 407 days.

(21) Appl. No.: 10/636,577

(22) Filed: Aug. 8, 2003

(65) Prior Publication Data

US 2004/0207856 A1    Oct. 21, 2004

(30) Foreign Application Priority Data

Aug. 9, 2002    (JP)    ............ P2002-233927

(51) Int. Cl.
*G06F 17/50*    (2006.01)
(52) U.S. Cl. ........................... 716/21; 716/2
(58) Field of Classification Search ............ 716/19–21, 716/2, 18; 430/5, 30
See application file for complete search history.

(56) References Cited

U.S. PATENT DOCUMENTS 6,563,594 B1 *   5/2003   Mikami ............... 356/614
6,636,311 B1 *  10/2003   Ina et al. ............ 356/401
6,790,564 B1 *   9/2004   Migitaka et al. ........ 430/5
6,801,314 B1 *  10/2004   Carpi et al. ........... 356/401
2004/0015808 A1 *  1/2004   Pang et al. ............ 716/19

FOREIGN PATENT DOCUMENTS

| JP | 09-246133 | 9/1997 |
| JP | 10-340847 | 12/1998 |
| JP | 2001-284203 | 10/2001 |

* cited by examiner

*Primary Examiner*—Thuan Do
*Assistant Examiner*—Binh Tat
(74) *Attorney, Agent, or Firm*—Finnegan, Henderson, Farabow, Garrett & Dunner, L.L.P.

(57) ABSTRACT

A design system of an alignment mark for manufacturing a semiconductor device includes a memory which stores at least mark data including pattern information regarding plural kinds of marks and process data including condition information of manufacturing processes, and a first process simulator which simulates a substrate structure before patterning based on the process data, the substrate structure being formed in an identified manufacturing process. Moreover, the design system includes a second process simulator which simulates a processed shape of an identified mark after the patterning based on the simulated substrate structure and the process data, the mark formed in the manufacturing process, a signal waveform simulator which simulates a detection signal waveform of the mark, the waveform being obtained from the simulated processed shape of the mark, and a signal evaluation device which evaluates a suitability of the mark for the identified manufacturing process based on the simulated detection signal waveform.

20 Claims, 8 Drawing Sheets

DESIGN SYSTEM OF ALIGNMENT MARKS FOR SEMICONDUCTOR MANUFACTURE

CROSS REFERENCE TO RELATED APPLICATION

This application is based upon and claims the benefit of priority from prior Japanese Patent Application No. 2002-233927, filed on Aug. 9, 2002; the entire contents of which are incorporated herein by reference.

BACKGROUND OF THE INVENTION

1. Field of the Invention

The present invention relates to a manufacturing method of a semiconductor device, and particularly, to a design method of arrangements and shapes of various kinds of alignment marks for use in manufacturing processes of the semiconductor device, and to a design system thereof.

2. Description of the Related Art

A semiconductor integrated circuit has a multilayered structure, and in manufacturing processes thereof, it is necessary that the semiconductor integrated circuit undergo no less than several ten lithography processes. In the lithography processes, positioning of each mask during exposure is performed by use of alignment marks in order to accurately align device patterns of lower layers and device patterns of upper layers. Moreover, in an alignment error test between the respective layers, marks for measuring errors, which are different from the alignment marks, are used. Furthermore, besides the marks for the lithography processes, marks for aligning a testing apparatus and a correction apparatus are also used. As described above, in the respective manufacturing processes of a semiconductor device, various kinds of marks in accordance with the respective processes are used. In addition, it is necessary that these marks be arranged in areas on the masks, where the device patterns are not formed, and arrangements of the marks are left to designers.

Regarding the alignment marks, manufacturers of exposure apparatuses and the others recommend use of alignment marks of specific shapes and sizes, and many manufacturers of semiconductors have mainly used these recommended alignment marks. However, actually, due to influences of substrate structures to be subjected to the lithography, process conditions, pattern densities of devices to be formed or the like, these alignment marks are not always suitable for the individual manufacturing processes in many cases. In this connection, actually, persons in charge of the respective manufacturing processes modify the alignment marks as appropriate for use.

However, it becomes more necessary to select the optimal marks for use in consideration of the influences of the process conditions and the like because a higher accuracy has come to be required also for the alignment as densities of LSI patterns have become higher.

Accordingly, for example, with regard to alignment marks for registering specific two layers, work has come to be performed, in which many kinds of marks for alignment and many kinds of marks for measuring alignment errors are prepared in advance, and after undergoing the actual semiconductor processes, the optimal marks for the concerned process are selected. This is because detection and measurement accuracies for the marks are changed due to differences between the shapes and dimensions of the marks.

However, when many marks are arranged on a wafer, if layers to be adjusted for alignment are increased in an area where the marks can be arranged, it is a burden for designers of an LSI to eliminate a contradiction between the mark arrangements in the previous and following processes.

Moreover, when the kind and number of marks are increased, in some cases, it becomes impossible to arrange all of the marks to be arranged on the wafer because the area where the marks can be arranged is limited.

Furthermore, a simulation of mark detection signals is sometimes performed when the optimal marks are to be selected based on a contrast of the mark detection signals. In many cases, the processes are actually performed, and the simulation is performed only for marks causing problems, and the shape of the masks is redesigned. However, cost required for the redesign has become a large burden.

Accordingly, it is desired to provide the optimal marks to respective manufacturing processes efficiently by performing a simulation regarding a mark design in advance without actually undergoing the processes. Moreover, it is desired a semiconductor manufacturing method that has a high accuracy and is capable of reducing cost by use of the foregoing mark design method.

SUMMARY OF THE INVENTION

An alignment mark design system according to a first aspect of the invention includes a memory which stores at least mark data including pattern information regarding plural kinds of marks and process data including condition information of manufacturing processes, and a first process simulator which simulates a substrate structure before patterning based on the process data. The substrate structure is formed in an identified manufacturing process. The alignment mark design system also includes a second process simulator which simulates a processed shape of an identified mark after the patterning based on the simulated substrate structure and the process data, the mark formed in the manufacturing process. Further, the alignment mark design system includes a signal waveform simulator which simulates a detection signal waveform of the mark and a signal evaluation device which evaluates a suitability of the mark for the identified manufacturing process based on the simulated detection signal waveform. The waveform is obtained from the simulated processed shape of the mark.

An alignment mark design method according to a second aspect of the invention includes identifying a target manufacturing process, selecting one or a plurality of marks recommended for the identified manufacturing process, reading mark data related to the selected one or a plurality of marks and process data related to the identified manufacturing process from mark data including mark pattern information and process data including condition information of manufacturing processes. The mark data and the process data are stored in a memory. The alignment mark design method also includes simulating a substrate structure before patterning based on the read process data, and simulating processed mark shapes after the patterning based on the simulated substrate structure and the read process data. The substrate structure is formed in the identified manufacturing process and the processed mark shapes are formed on a substrate in the identified manufacturing process. Further, the alignment mark design method includes simulating a detection signal waveform obtained from the simulated mark shapes, evaluating suitabilities of the marks for the identified manufacturing process based on the simulated detection signal waveform, and ordering the selected one or plurality of marks from an optimal one for the identified manufacturing process.

An alignment mark design method according to a third aspect of the invention includes designing marks for use in fabricating each layer of a semiconductor device having a plurality of layers. The designing process includes (a) selecting one or a plurality of mark candidates to be used with reference to the order of the marks to be used for the identified manufacturing process, the order being obtained by the mark design method according to claim 10, (b) obtaining arrangement rule data of the one or plurality of mark candidates, the arrangement rule data being stored in a memory, and (c) arranging marks on a mask or a wafer for the identified manufacturing process based on the arrangement rule data. Further, the alignment mark design method includes determining a presence of a contradiction between mark arrangements of the layers, and when the contradiction is present, correcting the arrangement rule; and repeating the steps (a) to (c) for the layers, and redesigning the marks.

A computer program product that includes a computer-readable medium according to a forth aspect of the invention is executed by a computer. The computer program product has instructions which, when executed by a computer, cause a process for designing alignment masks. The process includes identifying a target manufacturing process, selecting one or a plurality of marks recommended for the identified manufacturing process, and reading mark data related to the selected one or a plurality of marks and process data related to the identified manufacturing process from mark data including mark pattern information and process data including condition information of manufacturing processes. The mark data and the process data are stored in a memory. The process also includes simulating a substrate structure before patterning based on the read process data, and simulating processed mark shapes after the patterning based on the simulated substrate structure and the read process data. The substrate structure is formed in the identified manufacturing process and the processed mark shapes is formed on a substrate in the identified manufacturing process. Further the process includes simulating a detection signal waveform obtained from the simulated mark shapes, evaluating suitabilities of the marks for the identified manufacturing process based on the simulated detection signal waveform, and ordering the marks from an optimal one, A method of manufacturing a semiconductor device according to a fifth aspect of the invention employs alignment marks designed by the mark design method according to the second aspect of the invention.

DETAILED DESCRIPTION OF THE EMBODIMENTS

<First Embodiment>

A mark design system and a mark design method according to a first embodiment of the present invention are ones for selecting marks to be put into exposure areas of masks for use in the respective processes of a semiconductor manufacturing apparatus. Features thereof are to store data of various kinds of marks, processes and the like in advance, to compute processed mark shapes formed on a substrate and detection signal waveforms obtained from the marks by a simulation based on these data, and to decide marks suitable for the respective processes. A conventional procedure of mark selection performed randomly for each process and for each person in charge by trial and error can be standardized, redesign and the like can be eliminated, and the efficiency of the manufacturing processes in the semiconductor apparatus can be increased.

The first embodiment of the present invention will be described below with reference to the drawings.

Figure 1:
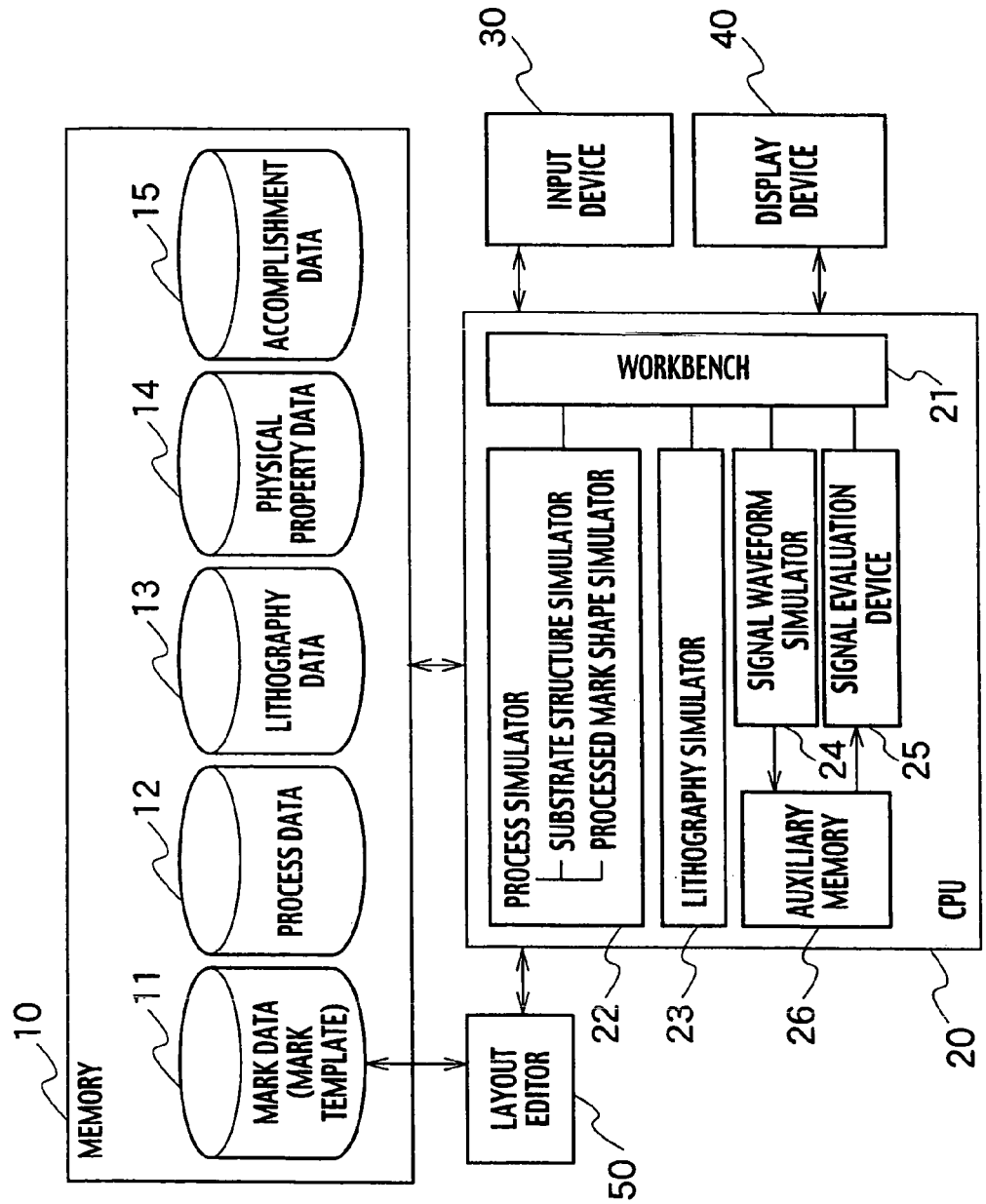
FIG. 1 is a view schematically showing a configuration of a mark design system according to a first embodiment of the present invention.

FIG. 1 is a view schematically showing a configuration of a mark design system according to the first embodiment of the present invention. Basically, this system includes a memory 10 storing various kinds of databases, a CPU 20 performing various kinds of simulations based on these databases, an input device 30, and a display device 40.

At least a mark data 11 and a process data 12 are stored in the memory 10, and preferably, a lithography data 13, the other physical property data 14 and an accomplishment data 15 are further stored therein.

Figure 2A:
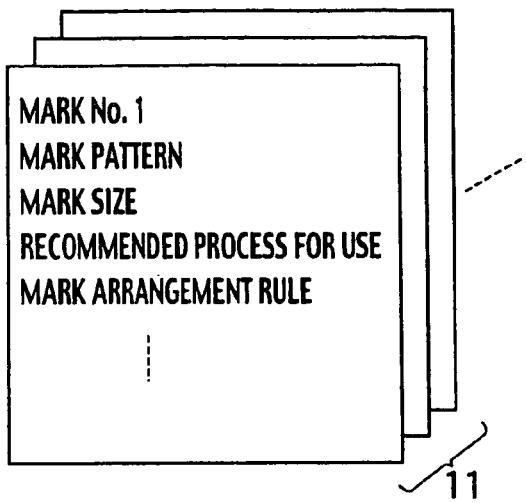
FIGS. 2A to 2C show various kinds of data stored in a memory of a mark design system according to the first embodiment of the present invention.
Figure 2B:
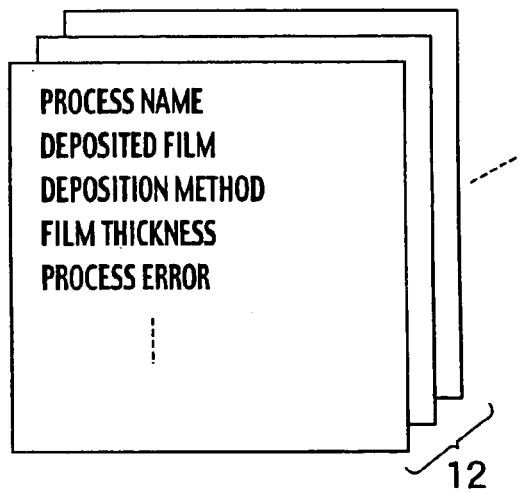
Figure 2C:
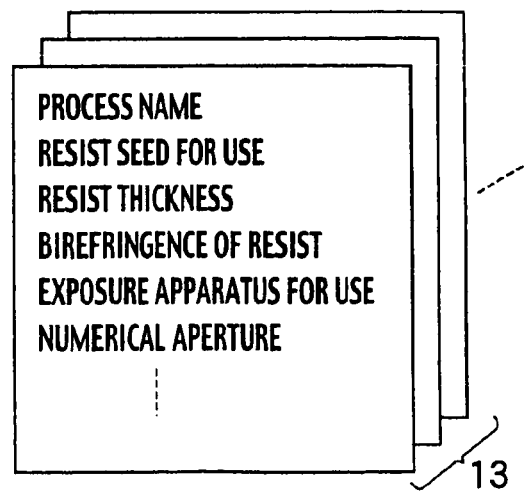

FIGS. 2A to 2C show specific examples of the various kinds of databases stored in the memory 10. As shown in FIG. 2A, as the mark data 11, data including a mark pattern (shape), a mark size, a recommended process for use, a mark arrangement rule and the like are stored for each mark. Here, the recommended process for use is data indicating for which process the concerned marks are suitably used. Note that, preferably, the mark pattern is stored as a mark template.

Figure 3A:
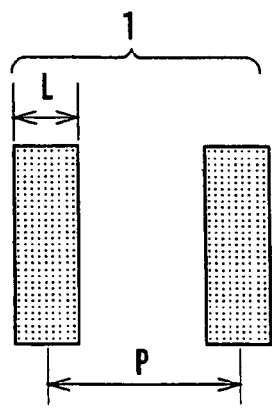
FIGS. 3A to 3E show mark patterns stored in the memory of the mark design system according to the first embodiment of the present invention.
Figure 3B:
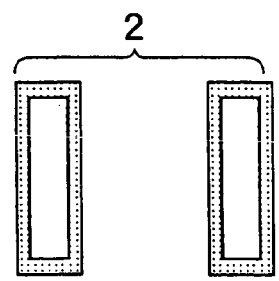
Figure 3C:
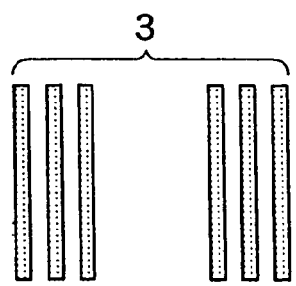
Figure 3D:
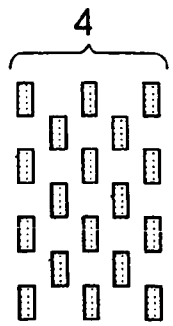
Figure 3E:
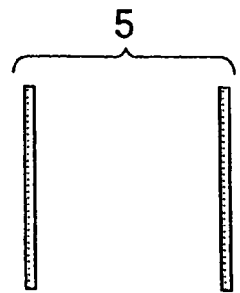

FIGS. 3A to 3E show examples of mark patterns stored as the mark data. There are listed various mark patterns for each process and each apparatus for use, for example, such as a basic rectangular pattern 1 with a width L of 6 ?m and a pitch P of 12 ?m as shown in FIG. 3A, a frame-shaped rectangular pattern 2 shown in FIG. 3B, a stripe pattern 3 shown in FIG. 3C, an identical pattern to a micro device pattern, which is shown in FIG. 3D, a micro line pattern shown in FIG. 3E, and the like.

As shown in FIG. 2B, as the process data 12, manufacturing process information such as a deposited film, a deposition method, a film thickness, an etching method for patterning, an etching depth and a process error is stored for each process.

As shown in FIG. 2C, as the lithography data 13, data including a resist for use, a thickness of the resist, a refractive index of the resist, an exposure device for use, and a numerical aperture of an exposure light source and the like are stored for each process.

Note that physical property data including transmissivities and refractive indexes of various substrates and deposition materials and the like are stored as the physical property data 14 in advance. Note that it is not necessary to provide the physical property data 14 independently, and the physical property data 14 may be prepared in a form included in the process data 12.

The accomplishment data 15 is data indicating which mark has been used for a mask in which process, that is, information such as a mask name and a product name when the marks are applied, which is capable of identifying the mask. The accomplishment data 15 is data rewritten whenever necessary. It is desirable that the other mark data and the other process data also be set in a state capable of being added and rewritten whenever necessary.

The CPU 20 includes at least a process simulator 22, a signal waveform simulator 24, and a signal evaluation device 25. Moreover, the CPU includes an auxiliary memory 26 for temporarily storing a detection signal waveform created by the signal waveform simulator and the like.

Note that the process simulator 22 includes the substrate structure simulator and the processed mark shape simulator. In addition, preferably, the CPU 20 also includes a lithography simulator 23.

All of these simulators and the signal evaluation device are ones capable of being called from the same platform, and are operated on a common workbench 21. Specifically, a selection screen corresponding to the workbench 21 is displayed on the display device 40, and any operation of the simulators is set capable of being selected from the same screen. With such a configuration, an integral simulation environment can be provided, thus making it possible to efficiently evaluate the signal by the simulations of the marks.

Among ones commercially available, for example, Tauras Work Bench made by AVANTI Corporation is usable as the platform. As the process simulator, Tauras-TOPO and T-SU-PREM 4 made by the AVANTI Corporation are usable. As the lithography simulator, SOLID-C made by SIGMA-C GmbH, which is a photolithography simulator, is usable.

Moreover, GDS II format made by CADENCE DESIGN SYSTEMS, INC. is usable as Computer Aided Design (CAD) data serving as a template of the mark pattern. Note that, in order to utilize the CAD data in the process simulator 22 and the lithography simulator 23, a layout editor 50 performing data conversion is required. As this layout editor, for example, SC-BROWSER made by SIGMA-C GmbH is usable.

Figure 4:
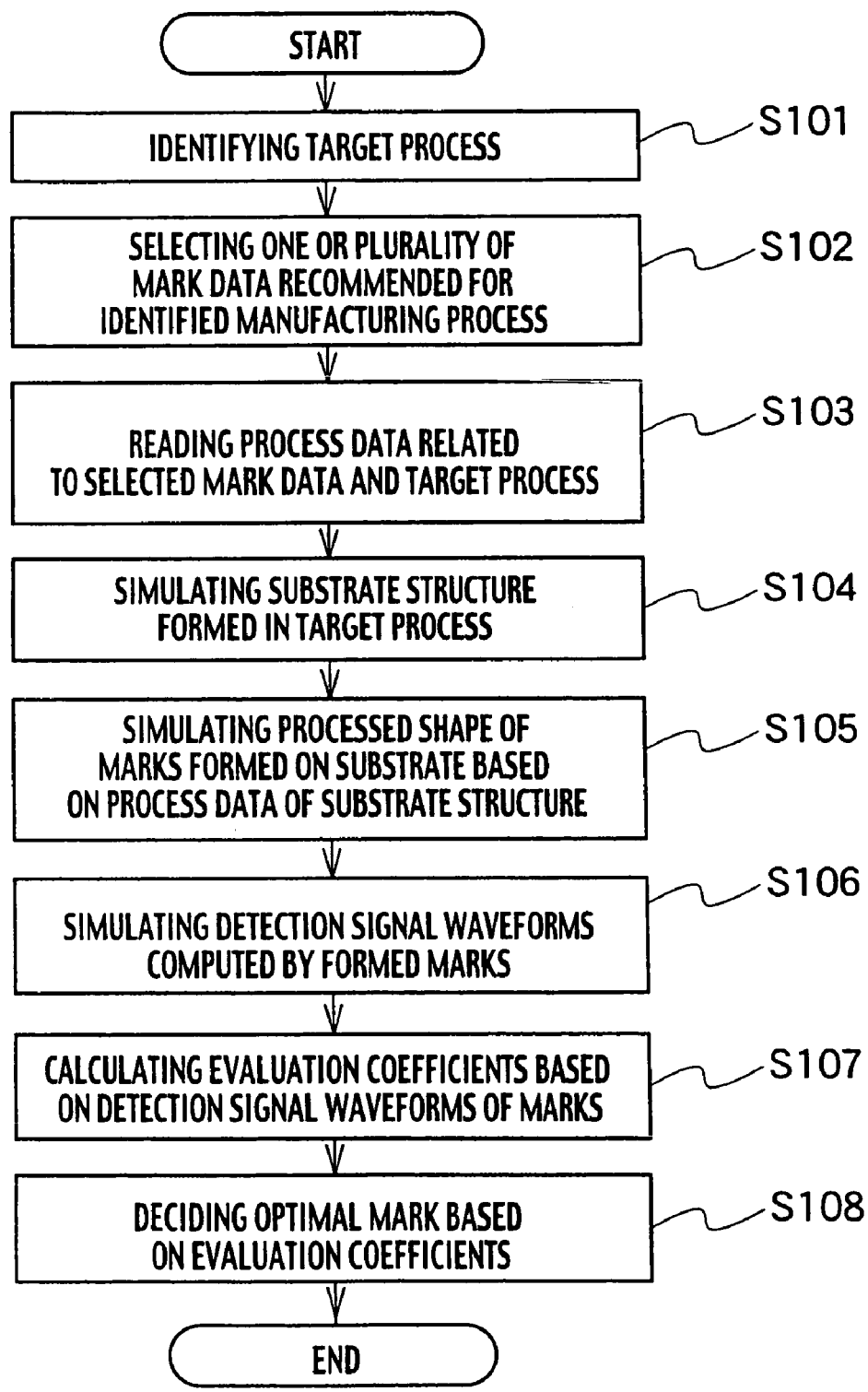
FIG. 4 is a flowchart showing a mark design method according to the first embodiment of the present invention.

Next, a procedure of the mark design method according to the first embodiment will be described with reference to the design system of FIG. 1 and the flowchart shown in FIG. 4. Note that, here, a case without using the lithography data 13 and the lithography simulator 23 will be described.

First, a target manufacturing process of mark selection is identified (S101). The manufacturing process is identified based on an entry by a system user to the input device 30. Next, one or a plurality of mark data recommended for the identified manufacturing process is selected (S102). For the mark data selection, marks recommended for use in a similar process in the past are selected with reference to the accomplishment data 15. For example, for a formation process of fine wiring patterns on an active area, a plurality of fine alignment marks used in the past from the mark template are displayed on the screen of the display device 40. From among the fine alignment marks, the system user selects appropriate ones. Alternatively, the fine alignment marks can be adapted to be selected by the system user from another mark template, or a mark pattern created originally by the system user can be adapted to be added.

Next, detailed data corresponding to the selected marks is read from the mark data 11, and the process data 12 related to the identified manufacturing process is read (S103). Note that the process data may be read at the point of time when the manufacturing process is identified in Step 101. The read data is stored, for example, in the auxiliary memory 26 in the CPU 20.

Figure 5A:
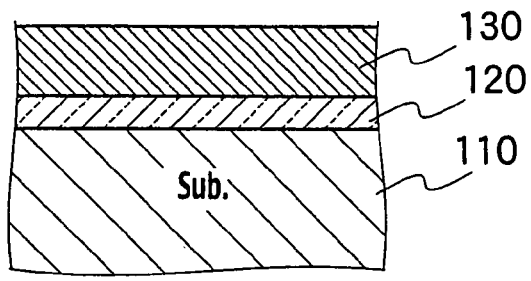
FIGS. 5A to 5C show cross-sectional structures of a substrate, a resist pattern and a processed mark pattern, all of which are formed in a process simulation according to the first embodiment of the present invention.

Subsequently, a substrate structure before patterning, which is formed in the identified manufacturing process, is simulated by the substrate structure simulator in the process simulator 22 based on the read process data (S104). For example, if a gate electrode formation process is identified, a substrate structure, in which an $SiO_2$ film 120 with a film thickness of several nm and a polycrystalline Si film 130 with a film thickness of 200 nm are formed on an Si substrate 110 as shown in FIG. 5A, is obtained by the simulation. Note that, while the formation of the deposited film is mainly simulated at this stage, the simulation may be simplified by omitting a factor, of which influence on a detection signal waveform simulation performed subsequently is regarded as negligible.

Figure 5B:
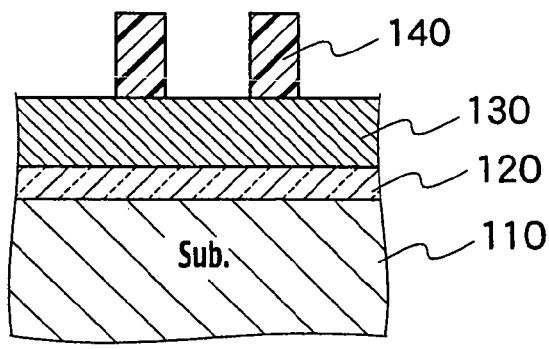
Figure 5C:
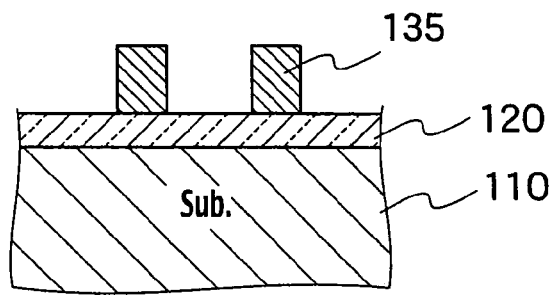

Next, the processed shapes of the respective marks are simulated by use of the processed mark shape simulator in the process simulator 22 based on the substrate structure thus obtained and the process data (S105). Note that, in order to process the marks, as shown in FIG. 5B, the resist pattern 140 is formed by the lithography process, the polycrystalline Si film 130 is etched by using the resist pattern 140 as an etching mask, and the processed mark pattern 135 shown in FIG. 5C is formed. Here, it is assumed that an ideal shape is obtained for the resist pattern 140.

Figure 6:
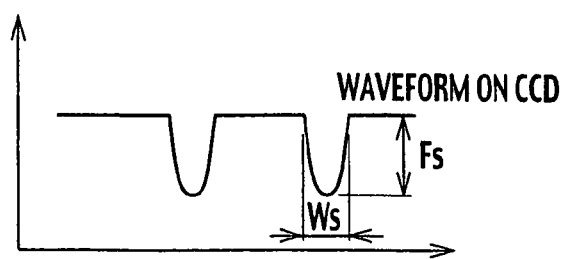
FIG. 6 shows a detection signal waveform computed by a simulation obtained by the mark design system according to the first embodiment of the present invention.

Subsequently, a mark detection signal waveform obtained from the processed mark shape computed by the simulation is simulated (S106). Here, the detection signal waveform corresponds to a distribution of reflected light intensities of the marks, which is obtained when light is irradiated onto the marks, and images of the marks are formed on the surface of an alignment sensor, for example, on the surface of a CCD device by use of an image-forming lens system. For example, FIG. 6 shows an example of a one-dimensional signal waveform crossing two patterns of a mark, which are rectangular and arrayed to form the mark. Note that this signal waveform may be displayed as a two-dimensional image. The obtained detection signal waveforms of the respective marks are temporarily stored in the auxiliary memory 26 in the CPU 20.

In the case of simulating the detection signal waveform, it is preferable to use, depending on cases, a simple solution, in which it does not take long to calculate though calculation accuracy is somewhat inferior, and a strict solution, in which calculation accuracy is high though it takes long to calculate. In the simple solution, for example, when light is incident onto an uneven surface of a substrate in an orthogonal direction, the light is naturally diffused in accordance with the unevenness, but it is assumed that the light having been incident onto the substrate further travels straight. Then, a phase and amplitude of light immediately above the substrate, which is reflected by the substrate, are computed based on the Fresnel's formula. From a result of the computation, the distribution of light intensities on the image-forming surface is computed based on the formula of partial coherent image formation. Meanwhile, in the strict solution, the diffusion of the reflected light when the illumination light is irradiated onto the uneven substrate is considered, the phase and amplitude of the light immediately above the substrate are computed by the Maxwell's equations, and the distribution of the light intensities on the image-forming surface is computed based on the formula of the partial coherent image formation. For example, it is preferable that the strict solution be used in the formation process of the active area, for which a fine pattern accuracy is required, and that the simple solution be used for other processes. The strict solution and the simple solution are used depending on the cases as described above, thus making it possible to perform the simulation more accurately and more rapidly.

Next, in order to determine whether or not the detection signal waveforms of the respective marks are good, evaluation coefficients of the detection signal waveforms are calculated (S107). As the evaluation coefficients, numerical values obtained by numerically evaluating items such as the signal strength Fs, a signal contrast, a shape of the signal waveform and a position of an alignment signal obtained by the waveform processing can be used.

An order is given to the respective marks based on the evaluation coefficients thus obtained, and one or the plurality of marks optimal for the identified manufacturing process are decided, in which the plurality of marks are decided from one of a higher order (S108). Specifically, the marks to be put into the exposure area of the mask for use in the identified manufacturing process are selected. Note that, in the case of ordering the marks, the order may be determined with emphasis on an evaluation coefficient of a specific item, or may be determined by the total points of all the evaluation coefficients.

Note that means for detecting the signal waveforms by the marks is not limited to optical means. For example, the signal waveforms may be detected by electron beams. In this case, also for the simulation, conditions adapted to the detection means are used.

As described above, according to the mark design system and the mark design method in accordance with the first embodiment, it is possible to select the marks suitable for the specific manufacturing process at the design stage in consideration of the influence of the actual process. Accordingly, it becomes unnecessary to redesign the marks after executing the process, and the optimal marks can be selected in the respective processes. Therefore, a more accurate semiconductor process can be provided.

<Second Embodiment>

A mark design method according to a second embodiment is also executed by use of the mark design system shown in FIG. 1. In the mark design method according to the second embodiment, more accurate mark design is performed by use of the lithography data 13 and the lithography simulator 23 though a basic procedure is common to that of the mark design method according to the first embodiment.

Figure 7:
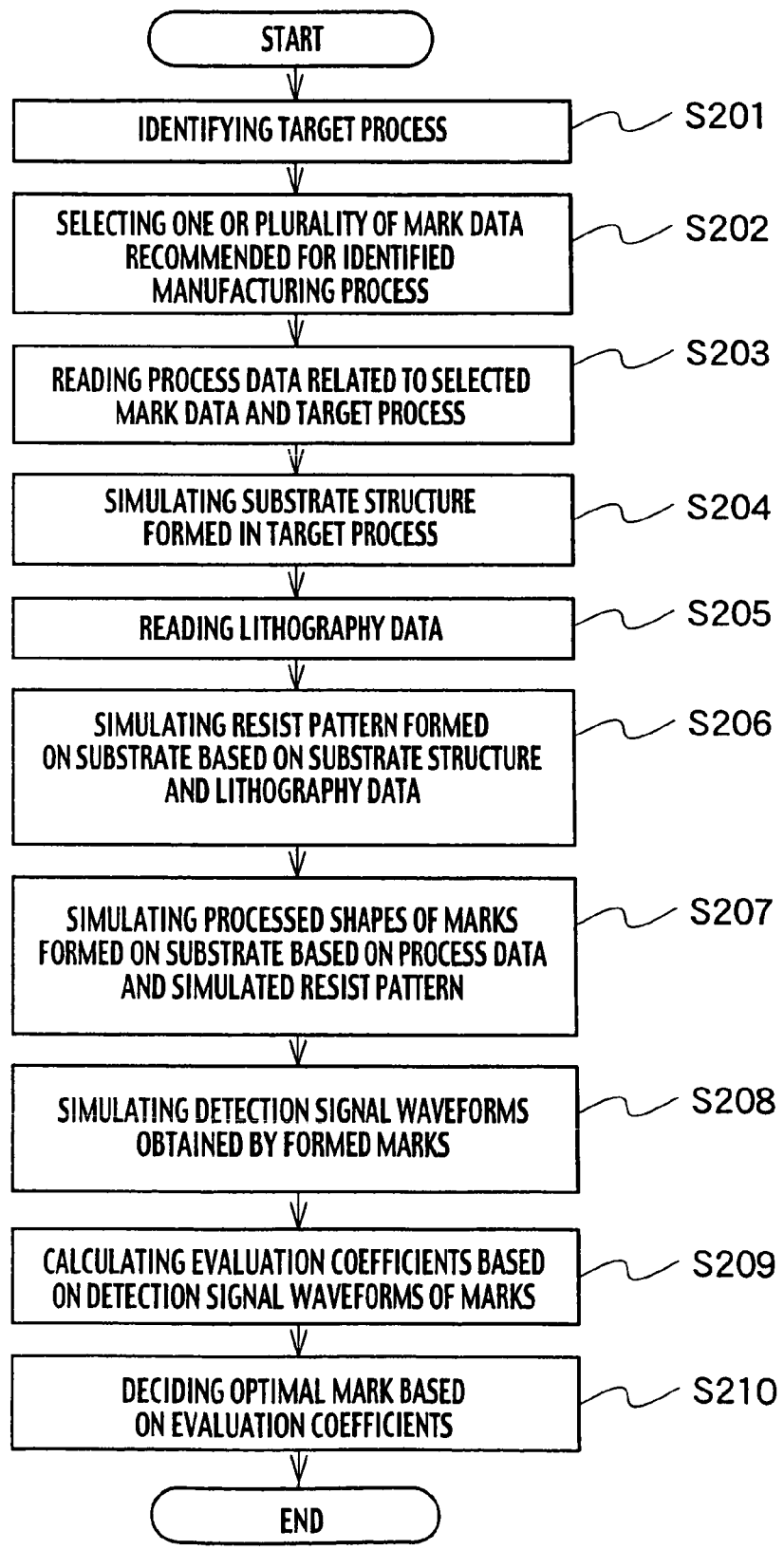
FIG. 7 is a flowchart showing a mark design method according to a second embodiment of the present invention.

FIG. 7 shows a flowchart of a mark design method according to the second embodiment. As shown in the drawing, a procedure from the step (S201) of identifying a target manufacturing process to the step (S204) of simulating a substrate structure formed in the target manufacturing process is identical to that of the mark design method according to the first embodiment.

In the mark design method according to the second embodiment, a substrate structure is computed by a simulation, and then the lithography data 13 for use in the target manufacturing process is read from the memory 10 (S205). As the lithography data 13, values relating to refractive indexes of substrate and resist materials with respect to exposure light, a numerical aperture (NA) of an exposure device, a light shape, a coherency factor, resist solubility, a focus and an aberration are stored.

Subsequently, the resist pattern 140 formed on the substrate, as shown in FIG. 5B, is simulated based on the substrate structure and the called lithography data (S206). Furthermore, the processed shape of a processed mark pattern 135 formed on the substrate, as shown in FIG. 5C, is simulated based on the process data and the simulated resist pattern (S207).

The following procedures from the step (S208) of simulating detection signal waveforms obtained by the respective marks to the step (S210) of deciding the optimal marks based on evaluation coefficients are performed similarly to that of the mark design method according to the first embodiment.

In the mark design method according to the second embodiment, the resist pattern shape is also simulated by use of the lithography data, and based on the simulation, the processed shape of the marks is simulated. Therefore, a more accurate simulation for the processed mark shape can be performed.

Note that the actual substrate structure, resist pattern shape or processed shape of the marks involves some variations due to errors of the process conditions and optical conditions. Accordingly, a simulation performed in consideration of these variation factors enables a more practical determination as to whether or not the marks are good. For this reason, with regard to the process variations in a film thickness when the substrate structure is decided, a focus and an exposure during the lithography simulation, and an etching amount during the process simulation, it is more preferable to perform the simulations while assuming the amounts of variations and errors. If the simulation of the detection signal waveforms thereof is performed for the processed mark shape involving the amounts of variations and errors to determine whether or not the detection signal waveforms are good, then it is made possible to determine whether or not the marks are good more accurately.

It is possible to optimize a relationship between the variation factors and the evaluation coefficients by use of a robust design method such as Taguchi Method. Note that Taguchi Method is a quality control method contrived by Dr. Genichi Taguchi, which is expounded, for example, in "Guide to Quality Engineering Computation (*Hinshitsu Kogaku Keisan Nyumon*, written by Hiroshi Yano, Japanese Standards Association, published in 1998).

<Third Embodiment>

A mark design method according to a third embodiment is a method of deciding in which area on the mask or the wafer one or a plurality of the optimal marks selected from many candidates of the marks by the mark design method according to the first or second embodiment are arranged. For the decision of the positions where the marks are arranged, it is necessary to adjust the plurality of masks for which the multiplex exposure is performed.

Figure 8:
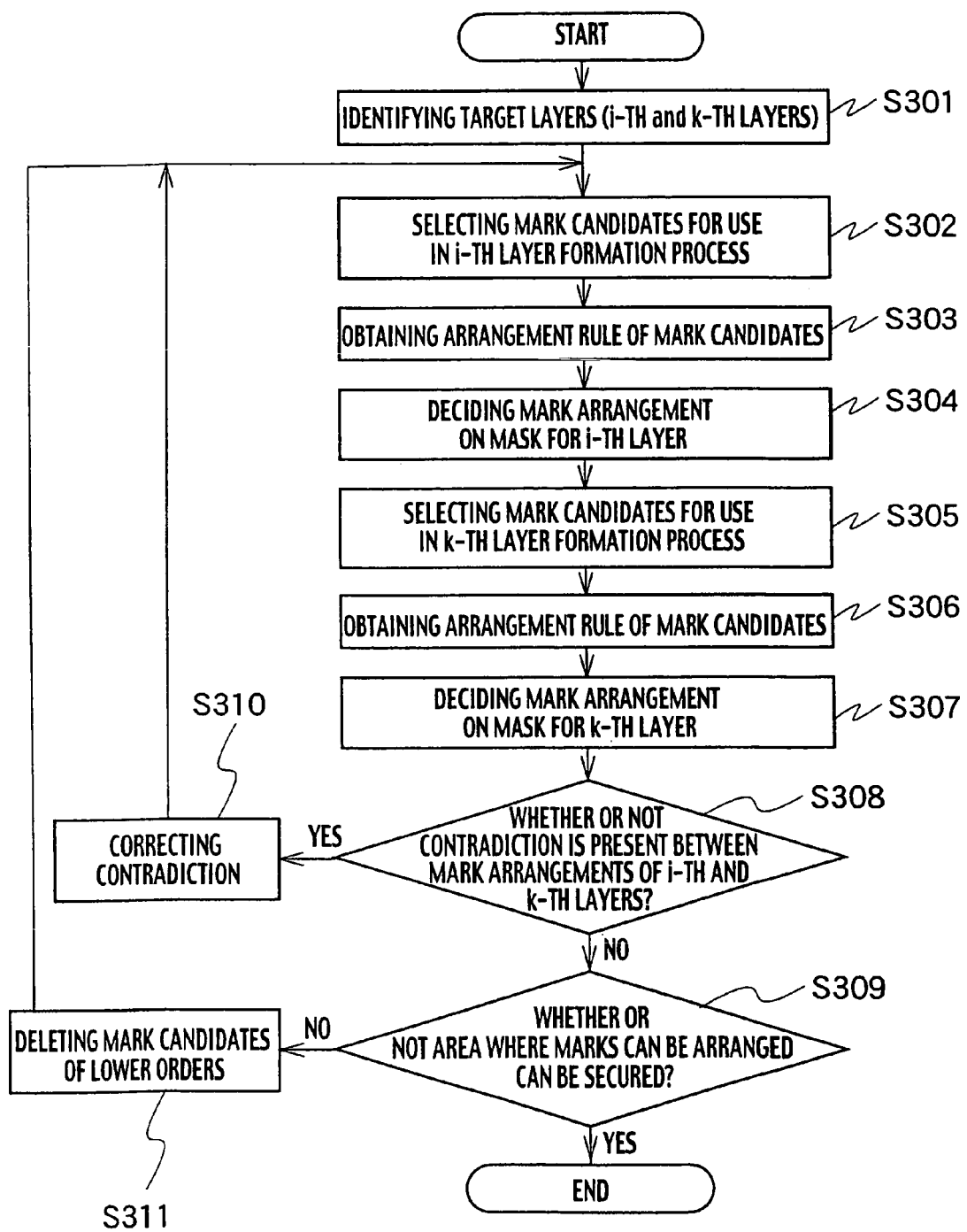
FIG. 8 is a flowchart showing a mark design method according to a third embodiment of the present invention.

FIG. 8 is a flowchart showing a method of deciding the positions where the marks are arranged on the masks for: use in forming the i-th and k-th layers for which the adjustment is necessary in the case of performing the multiplex exposure.

Note that an occupied area with marks and a mark arrangement rule for each mark are accumulated in advance as a part of the mark data. The occupied area with marks includes not only a mark but also an area around the mark, where another pattern is prohibited from being arranged. Moreover, the mark arrangement rule means a rule relating to an arrangement of the marks, such as, for example, that marks should be arranged on four vertexes of a rectangular exposure area.

First, a system user specifies layers for which the arrangement and adjustment of the marks are required, for example, the i-th and k-th layers here (S301). Next, candidates of marks for use in the process of forming the i-th layer are selected (S302). This selection of the mark candidates is performed in accordance with the order obtained by the mark design method related to the mark selection according to the first or second embodiment, and plural kinds of marks are selected. Subsequently, data of the arrangement rules of the respective selected marks is obtained (S303), and based on this data of the arrangement rules, the arrangements of the respective marks on the mask for the i-th layer are decided sequentially (S304). In this case, the arrangements are decided such that areas prohibited from being masked are not overlapped with one another on the same mask.

Next, candidates of marks for use in the process of forming the k-th layer are selected in a procedure similar to that in the case of the i-th layer (S305). The arrangement rules of the respective selected marks are obtained (S306), and based on this data of the arrangement rules, the arrangements of the respective marks on the mask for the k-th layer are decided sequentially (S307).

Thereafter, it is determined whether or not a contraction is present between the mark arrangements on the i-th layer and the k-th layer (S308). The determination as to whether or not a contradiction is present between the arrangements is performed while taking notice of a relationship between an exposure context and layers for which alignment errors are measured, the relationship being shown in a so-called alignment tree. Therefore, it is preferable that this alignment tree also be stored as data in the memory in advance.

Particularly, in the case of marks for measuring an alignment error, between which layers the alignment error is measured is decided by the alignment tree. Therefore, the arrangements of the marks for the measurement must be adapted to the alignment tree. In addition, because the alignment tree may be sometimes changed while the semiconductor device is being prototyped, it is necessary that an optional arrangement capable of coping with the change also be stored as data in advance. Specifically, for example, when marks of the respective layers, which are not to be overlapped, are arranged in positions where the marks are overlapped, it is determined that a contradiction is present between the mark arrangements.

If a contradiction is present between the arrangements (YES), the contradiction is corrected (S310). Then, returning to Step 302, the procedure of the mark arrangements from Step 302 to Step 307 is repeated. The correction of the contradiction can be performed by various methods such as a correction of the arrangement rule and a setting change of the area where another pattern is prohibited from being arranged.

If the contradiction is not present between the mark arrangements of the i-th and k-th layers (NO), it is determined whether or not an area where the marks can be arranged can be secured (S309). The area where the marks can be arranged is limited because the marks are formed in an area on the wafer, which is other than the area where the device is formed. Hence, in some cases, the area where the marks are arranged becomes deficient when plural kinds of marks are arranged. Accordingly, if the area where the marks are arranged becomes deficient (NO), mark candidates of lower orders are deleted (S311). Specifically, a correction to reduce the number of candidates is performed. After the deletion at Step 311, the process returns to S302 again, and the procedure of the mark arrangements from Step 302 to Step 307 is repeated. If the area where the marks can be arranged can be secured (YES), the mark arrangements are finally decided after Step 309.

Figure 9:
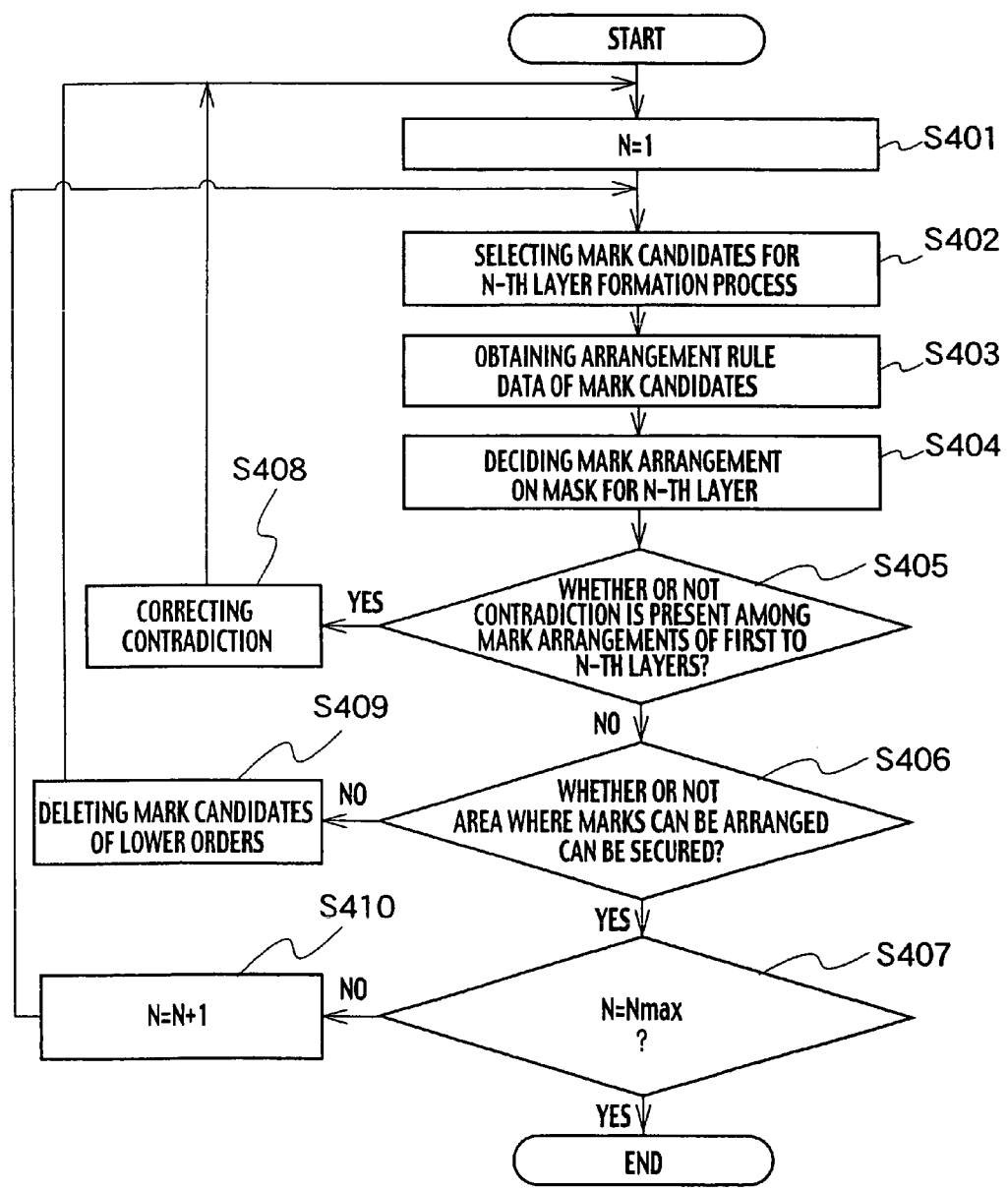
FIG. 9 is a flowchart showing another mark design method according to the third embodiment of the present invention.

The mark arrangement method described above with reference to FIG. 8 is one adjusting the positions where the marks are arranged between the plurality of specific layers. FIG. 9 is a flowchart showing a procedure of a mark arrangement method of adjusting the mark arrangements for all of the layers of the semiconductor device. The basic adjustment procedure of the arrangements is common to that shown in FIG. 8.

First, N is set at 1 (S401), and mark candidates for a process of forming an N-th layer, that is, the first layer, are selected (S402). Then, data of an arrangement rule for each mark candidate is obtained (S403), and based on this data, mark arrangements on a mask for the N-th layer, that is, the first layer, are decided (S404).

Subsequently, it is determined whether or not a contradiction is present among the mark arrangements of the first to N-th layers (S405). If the contradiction is present, the contradiction is corrected by a method such as adding data correcting the contradiction to the data of the mark arrangement rules (S408). Then, returning to Step 401, a series of the processes for the arrangements of the marks is repeated. If the contradiction is not present among the mark arrangements of the respective layers, it is determined whether or not the area where the marks can be arranged can be secured (S406). If the area where the marks can be arranged becomes deficient, mark candidates of lower orders are deleted (S409). Then, the process returns to Step 401, from which the mark arrangements for the respective layers are redone from the first layer.

If the area where the marks can be arranged is secured (YES), the process proceeds to the next step, where it is confined whether or not a mark arrangement for the uppermost layer (Nmax layer) is ended (S407). If the mark arrangement for the uppermost layer is not ended, N is incremented by 1 (N=N+1) (S410). Then, the process returns to Step 402, from which the mark arrangements are repeated.

Note that, though the arrangements are redone from the first layer if the contradiction of the arrangements occurs in the flowchart shown in FIG. 9, the arrangements of all of the layers may not be redone, but the arrangements may be redone from one or several layers before a layer with which the contradiction occurs.

There are various purposes in the marks, and degrees of freedom in the positions where the marks are arranged differ depending on the purposes. Hence, for example, with regard to the arrangements, an order is sequentially given to a fused mark, an alignment error detection mark, a fine alignment mark and a search alignment mark, data of the arrangement rules is created, and the marks are arranged in accordance therewith. It is desirable to correct the rules of the positions where the marks are arranged in consideration of the order of the mark arrangements also in the case of correcting the contradiction among the mark arrangements.

Note that it is not always necessary for the mark arrangement method described above to pass through the mark design methods according to the first and second embodiments. If recommended mark patterns are decided to some extent in the respective processes, the positions where the marks are arranged may be decided by directly using the above-described mark design method according to the third embodiment.

The mark arrangements thus decided are stored as data of arrangement coordinates in the memory. Hence, the data can be transferred to other device such as an exposure device, an alignment error testing device, a dimension measurement device and a focused ion beam device, and can be utilized therein.

Although the contents of the present invention have been described above in accordance with the embodiments, it is obvious to those skilled in the art that various variations and modifications are further possible. For example, though the above-described embodiments have been described by taking, as main examples, the marks arranged on the mask, it is not necessary to arrange the marks on the mask in the case of a direct drawing of the marks on the wafer by use of an electron beam drawing apparatus. By replacing the matter relating to the mask with a matter relating to a chip, mark candidates drawn on the chip can be obtained in a similar procedure. In this case, with regard to the lithography simulation, naturally, not the simulation of the photolithography based on optical transfer but a simulation of electron beam lithography is performed.

It is also possible to cope with cases of using other lithography devices by performing lithography simulations corresponding thereto.

Moreover, it is needless to say that the mark design methods according to the above-described embodiments can be executed by allowing a computer (CPU 20) to implement the respective steps by use of a program. The programs are saved in a recording medium. The recording medium may be selected from semiconductor memories, magnetic disks, optical disks, optomagnetic disks, magnetic tapes, and any of the computer-readable recording mediums.

As described above, according to the mark design system and mark design method of the present invention, the detection signal waveforms obtained in the case of using the respective marks can be obtained by the simulation based on the mark data and the process information data, which are stored in the memory, without performing the actual processes. It can be determined whether the marks are good or bad based on the detection signal waveforms thus obtained. Hence, at the stage of the design, it is possible to select the marks suitable for the respective processes in consideration of the influences of the processes. Therefore, time is not wasted uselessly for the redesign of the marks. A conventional optimization of the mark conditions, which has been performed randomly for each process and for each person in charge can be standardized in the entire semiconductor manufacturing processes, thus enabling the optimization to be performed more efficiently.

Moreover, according to a manufacturing method of a semiconductor device by use of the mark design method of the present invention, wasteful cost for the redesign can be reduced, and the marks optimal for the respective processes can be used. Therefore, a more accurate semiconductor device can be provided.

What is claimed is:

1. An alignment mark design system, comprising:
   a first memory which stores:
      a plurality of templates of alignment marks, and
      process data of a plurality of manufacturing processes;
   a first process simulator which simulates a substrate structure formed, before patterning, by a selected one of the manufacturing processes, based on the process data;
   a second process simulator which simulates a processed shape of at least one of the marks formed, by the selected manufacturing process, based on the simulated substrate structure and the process data;
   a signal waveform simulator which simulates a detection signal waveform generated by the simulated processed shape; and
   a signal evaluation device which evaluates a suitability of the at least one of the marks, based on the simulated detection signal waveform.

2. The alignment mark design system according to claim 1, wherein:
   the first memory also stores lithography data including lithography condition information,
   the alignment mark design system further comprises a lithography simulator which simulates a shape of a resist pattern based on the simulated substrate structure and the lithography data, and
   the simulated processed shape after the patterning is based on the simulated shape of the resist pattern in addition to the simulated substrate structure and the process data.

3. The alignment mark design system according to claim 1, further comprising
   a second memory which stores the simulated detection signal waveform,
   wherein the signal evaluation device has a mark determination function of reading detection signal waveforms from the marks for the manufacturing processes from the second memory, evaluating the detection signal waveforms, and ordering the marks from an optimal mark.

4. The alignment mark design system according to claim 1,
   wherein the first memory stores accomplishment data indicating which mark has been used in which manufacturing process.

5. The alignment mark design system according to claim 4, further comprising
   a mark selection device which specifies at least one of the marks to be considered for use in the selected one of the manufacturing processes with reference to the accomplishment data.

6. The alignment mark design system according to claim 1,
   wherein the first and second process simulators, the signal waveform simulator and the signal evaluation device have a same platform.

7. The alignment mark design system according to claim 1,
   wherein the first and second process simulators perform simulations in consideration of an error factor due to process variations.

8. The alignment mark design system according to clam 1,
   wherein the signal evaluation device uses at least one of a signal peak intensity, a signal intensity contrast, and a symmetry of a signal waveform shape as an evaluation item.

9. The alignment mark design system according to claim 2,
   wherein the lithography simulator is a photolithography simulator or an electron beam lithography simulator.

10. An alignment mark design method, comprising:
    identifying a target manufacturing process;
    selecting at least one of a plurality of marks recommended for the identified manufacturing process;
    reading mark data related to the selected at least one mark and process data related to the identified manufacturing process from mark data including mark pattern information and process data including condition information of the manufacturing processes, the mark data and the process data being stored in a first memory;

simulating a substrate structure before a patterning based on the read process data, the substrate structure being formed in the identified manufacturing process;

simulating a processed shape of the selected at least one mark after the patterning based on the simulated substrate structure and the read process data, the processed shape being formed on the substrate structure in the identified manufacturing process;

simulating a detection signal waveform obtained from the simulated processed shape;

evaluating a suitability of the selected at least one mark for the identified manufacturing process based on the simulated detection signal waveform; and ordering the selected at least one mark from an optimal mark for the identified manufacturing process.

11. The alignment mark design method according to claim 10, further comprising:

reading lithography data corresponding to the identified manufacturing process from lithography data including lithography condition information, the lithography data being stored in the first memory in advance; and simulating a shape of a resist pattern based on the simulated substrate structure and the read lithography data, wherein, in the simulation of the processed shape of the selected at least one mark, the processed shape of the selected at least one mark after the patterning is simulated based on the simulated shape of the resist pattern in addition to the simulated substrate structure and the process data.

12. The alignment mark design method according to claim 10, wherein the selected at least one mark are selected based on past accomplishment data stored in the first memory in advance.

13. The alignment mark design method according to claim 10, further comprising:

selecting at least one of a plurality of mark candidates to be used with reference to the obtained order of the marks to be used for the identified manufacturing process;

reading arrangement rule data of the mark candidates in the identified manufacturing process, the arrangement rule data being stored in the first memory in advance; and arranging the at least one mark candidate on a mask or a wafer for the identified manufacturing process.

14. An alignment mark design method, comprising:

designing marks for use in fabricating each layer of a semiconductor device having a plurality of layers, the designing including following steps (a) to (c), (a) selecting at least one of a plurality of mark candidates to be used with reference to the order of the marks to be used for the identified manufacturing process, the order being obtained by the mark design method according to claim 10, (b) obtaining arrangement rule data of the at least one of a plurality of mark candidates, the arrangement rule data being stored in a first memory, and (c) arranging the marks on a mask or a wafer for the identified manufacturing process based on the arrangement rule data;

determining a presence of a contradiction between the arranged marks in the layers, and when the contradiction is present, correcting the arrangement rule; and repeating the steps (a) to (c) for the layers, and redesigning the marks.

15. The alignment mark design method according to claim 14, further comprising determining whether or not an area where the marks are arranged is deficient after the steps (a) to (c) and before the redesign of the marks, and when the area is deficient, deleting at least any of marks low in using order from the mark candidates.

16. An alignment mark design method, comprising:

designing marks for use in fabricating each layer of a semiconductor device having a plurality of layers, the designing including following steps (a) to (c), (a) selecting at least one of a plurality of mark candidates to be used with reference to the order of the marks to be used for the identified manufacturing process, the order being obtained by the mark design method according to claim 11, (b) obtaining arrangement rule data of the at least one of a plurality of mark candidates, the arrangement rule data being stored in a first memory in advance, and (c) arranging marks on a mask or a wafer for the identified manufacturing process based on the arrangement rule data;

determining a presence of a contradiction between the arranged marks in the layers, and when the contradiction is present, correcting the arrangement rule; and repeating the steps (a) to (c) for the layers, and redesigning the marks.

17. The alignment mark design method according to claim 16, further comprising determining whether or not an area where the marks are arranged is deficient after the steps (a) to (c) and before the redesign of the marks, and when the area is deficient, deleting at least any of marks low in using order from the mark candidates.

18. A computer program product that includes a computer-readable medium having instructions which, when executed by a computer, causes the computer to execute a process for designing an alignment mark, the process comprising:

identifying a target manufacturing process;

selecting at least one of a plurality of marks recommended for the identified manufacturing process;

reading mark data related to the selected at least one mark and process data related to the identified manufacturing process from mark data including mark pattern information and process data including condition information of the manufacturing processes, the mark data and the process data being stored in a first memory;

simulating a substrate structure before patterning based on the read process data, the substrate structure being formed in the identified manufacturing process;

simulating a processed shape of the selected at least one mark after the patterning based on the simulated substrate structure and the read process data, the processed shape being formed on the substrate structure in the identified manufacturing process;

simulating a detection signal waveform obtained from the simulated processed shape;

evaluating a suitability of the selected at least one mark for the identified manufacturing process based on the simulated detection signal waveform; and ordering the marks from an optimal mark.

19. The computer program product according to claim 18, wherein the process further comprising:

reading lithography data corresponding to the identified manufacturing process from lithography data including lithography condition information, the lithography data being stored in the first memory in advance; and simulating a resist pattern shape based on the simulated substrate structure and the read lithography data, wherein, in the simulation of the processed shape, the processed shape after the patterning is simulated based on the simulated shape of the resist pattern in addition to the simulated substrate structure and the process data.

20. A method of manufacturing a semiconductor device, wherein alignment marks designed by the mark design method according to claim 10 are used.

* * * * *

UNITED STATES PATENT AND TRADEMARK OFFICE
CERTIFICATE OF CORRECTION

PATENT NO. : 7,100,146 B2
APPLICATION NO. : 10/636577
DATED : August 29, 2006
INVENTOR(S) : Sato et al.

Page 1 of 1

It is certified that error appears in the above-identified patent and that said Letters Patent is hereby corrected as shown below:

Claim 8, column 12, line 52, change "clam" to --claim--.

Claim 12, column 13, line 37, change "are" to --is--.

Signed and Sealed this

Nineteenth Day of December, 2006

JON W. DUDAS
*Director of the United States Patent and Trademark Office*